United States Patent
Dames et al.

(10) Patent No.: US 9,494,620 B2
(45) Date of Patent: Nov. 15, 2016

(54) FLEXIBLE CURRENT SENSOR ARRANGEMENT

(71) Applicant: Sentec Ltd, Cambridge (GB)

(72) Inventors: Andrew Nicholas Dames, Cambridge (GB); Mathew Price, Cambridge (GB); Robert Davidson, Cambridge (GB)

(73) Assignee: Sentec Ltd, Cambridge (GB)

( * ) Notice: Subject to any disclaimer, the term of this patent is extended or adjusted under 35 U.S.C. 154(b) by 157 days.

(21) Appl. No.: 14/364,219

(22) PCT Filed: Dec. 21, 2012

(86) PCT No.: PCT/GB2012/053257
§ 371 (c)(1),
(2) Date: Jun. 10, 2014

(87) PCT Pub. No.: WO2013/093516
PCT Pub. Date: Jun. 27, 2013

(65) Prior Publication Data
US 2014/0333284 A1    Nov. 13, 2014

(30) Foreign Application Priority Data
Dec. 23, 2011  (GB) .................................. 1122328.6

(51) Int. Cl.
*G01R 15/18* (2006.01)
*G01R 3/00* (2006.01)
(Continued)

(52) U.S. Cl.
CPC .............. *G01R 15/181* (2013.01); *G01R 3/00* (2013.01); *G01R 19/0084* (2013.01);
(Continued)

(58) Field of Classification Search
CPC .......... G01R 19/0092; G01R 19/0084; G01R 15/181; G01R 3/00; G01R 1/20; G01R 31/025; G01R 31/2642; G01R 27/14; G01R 27/16; G01P 3/46; Y10T 29/4902
USPC ......... 324/76.11, 177, 348, 522, 713; 702/1, 702/38, 57, 64
See application file for complete search history.

(56) References Cited

U.S. PATENT DOCUMENTS 3,434,052 A    3/1969  Fechant
9,007,077 B2 *  4/2015  El-Essawy ........... G01R 15/205
                                                  324/117 H
(Continued)

FOREIGN PATENT DOCUMENTS

CN    2562191 Y    7/2003
CN    101044408 A  9/2007
CN    102576038 A  7/2012

OTHER PUBLICATIONS

International Preliminary Report on Patentability for International Application No. PCT/GB2012/053257, International Filing Date Dec. 21, 2012, Submission Date Oct. 23, 2013, Search Completed Mar. 17, 2014, 22 pgs.
(Continued)

Primary Examiner — Hoai-An D Nguyen
(74) Attorney, Agent, or Firm — KPPB LLP

(57) ABSTRACT

A flexible current sensor arrangement comprises a plurality of discrete current sensing elements distributed along an elongate flexible carrier. An elongate flexible member for a current sensor arrangement comprises a plurality of carrying portions linked to one another by hinge portions, each carrying portion being configured for receiving a discrete current sensing element. A method of manufacturing a flexible current sensor arrangement comprises providing an elongate flexible carrier, and distributing a plurality of discrete sensing elements along the elongate flexible carrier.

20 Claims, 16 Drawing Sheets

(51) Int. Cl.
  *G01R 27/08*  (2006.01)
  *G01R 19/00*  (2006.01)
  *G01R 31/02*  (2006.01)
  *G01R 27/16*  (2006.01)
  *G01R 27/14*  (2006.01)

(52) U.S. Cl.
  CPC ....... *G01R 19/0092* (2013.01); *G01R 31/025* (2013.01); *G01R 27/14* (2013.01); *G01R 27/16* (2013.01); *Y10T 29/4902* (2015.01)

(56) References Cited

U.S. PATENT DOCUMENTS

| | | | | |
|---|---|---|---|---|
| 9,192,321 | B2* | 11/2015 | Fukuda | A61B 5/0537 |
| 2007/0203396 | A1* | 8/2007 | McCutcheon | A61B 1/00082 600/173 |
| 2007/0290695 | A1* | 12/2007 | Mahon | G01R 15/181 324/713 |
| 2009/0251308 | A1* | 10/2009 | Schweitzer, III | G01R 1/22 340/539.1 |
| 2011/0148561 | A1 | 6/2011 | Michel et al. | |

OTHER PUBLICATIONS

International Search Report and Written Opinion for International Application No. PCT/GB2012/053257, International Filing Date Dec. 21, 2012, Search Completed Mar. 8, 2013, Mailed Mar. 19, 2013, 7 pgs.

China Search Report for Application No. 201280064157X, Filing Date Dec. 21, 2012, Mailed Feb. 18, 2016, 2 pgs.

* cited by examiner

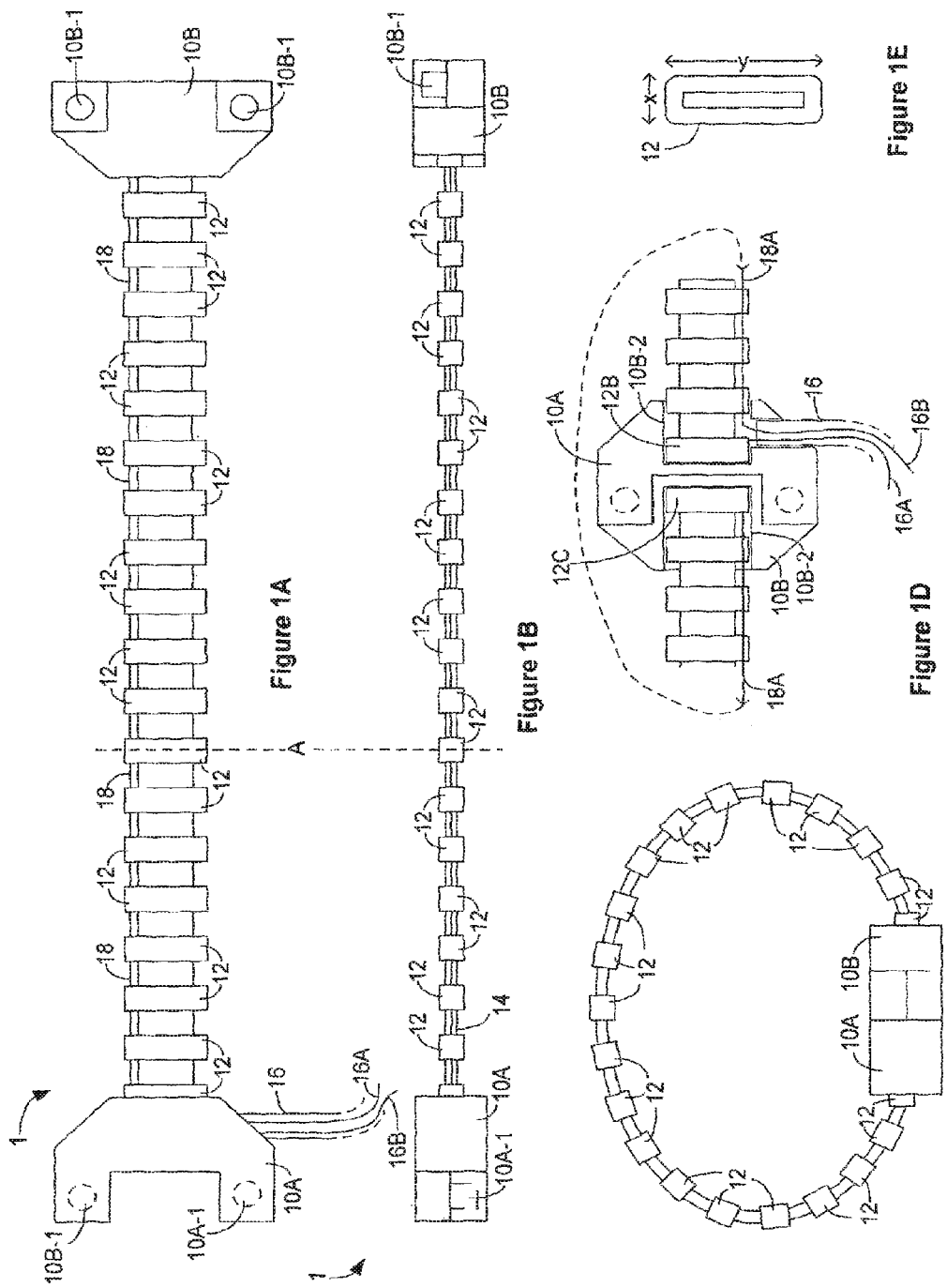

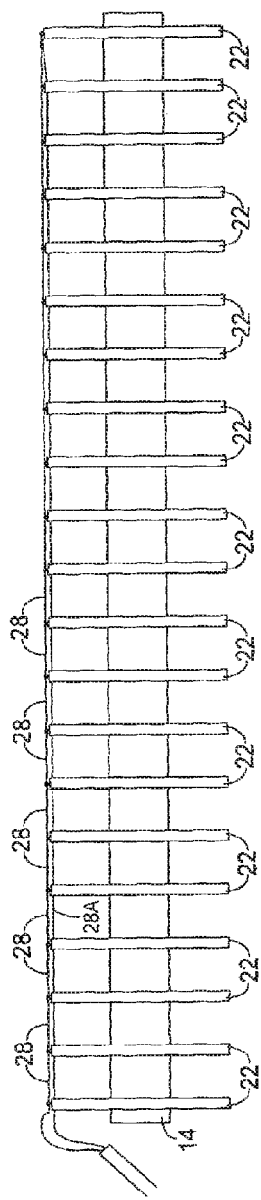
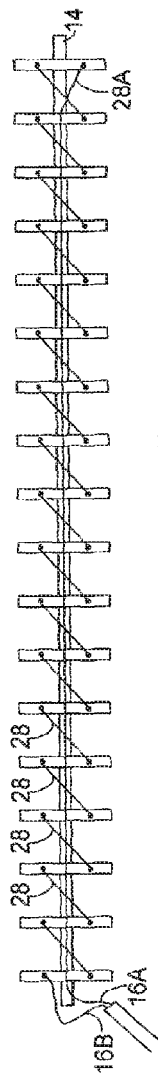
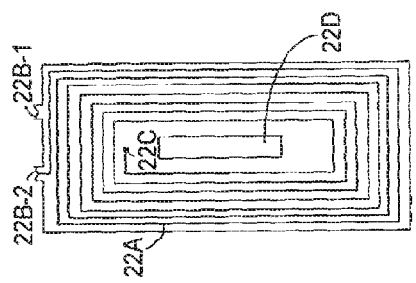
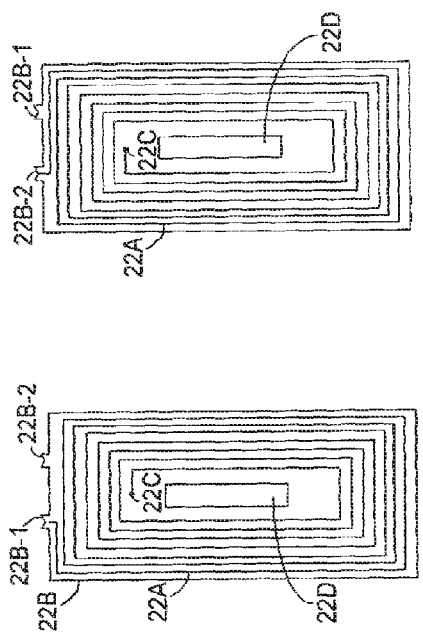
Figure 2A
Figure 2B
Figure 2C
Figure 2D

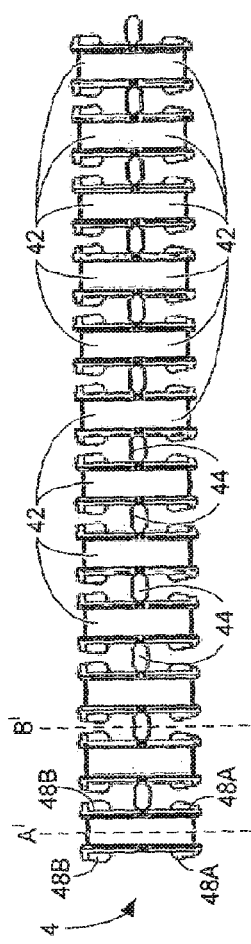
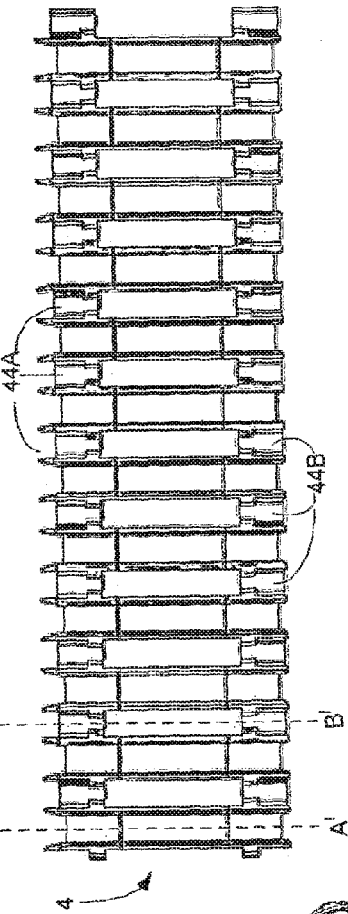
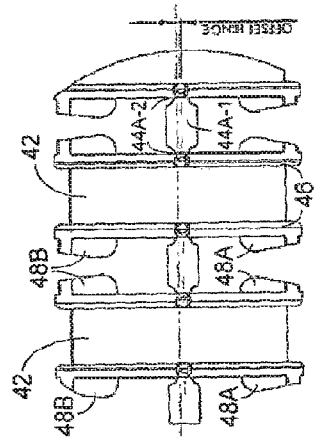
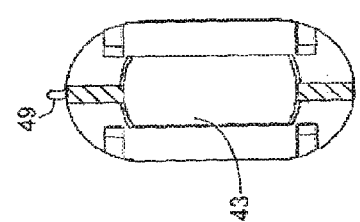
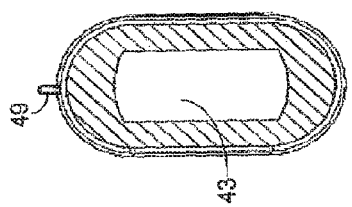
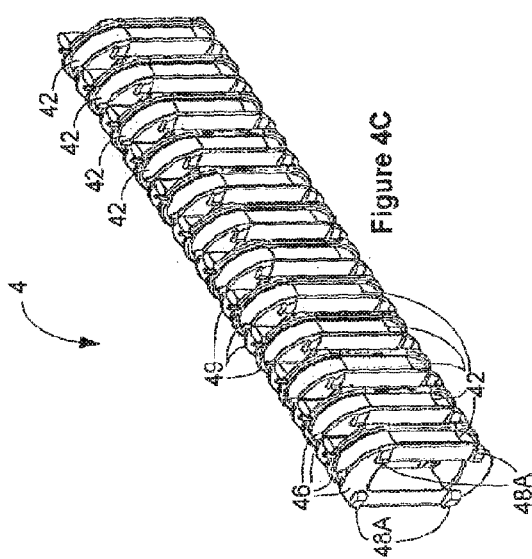

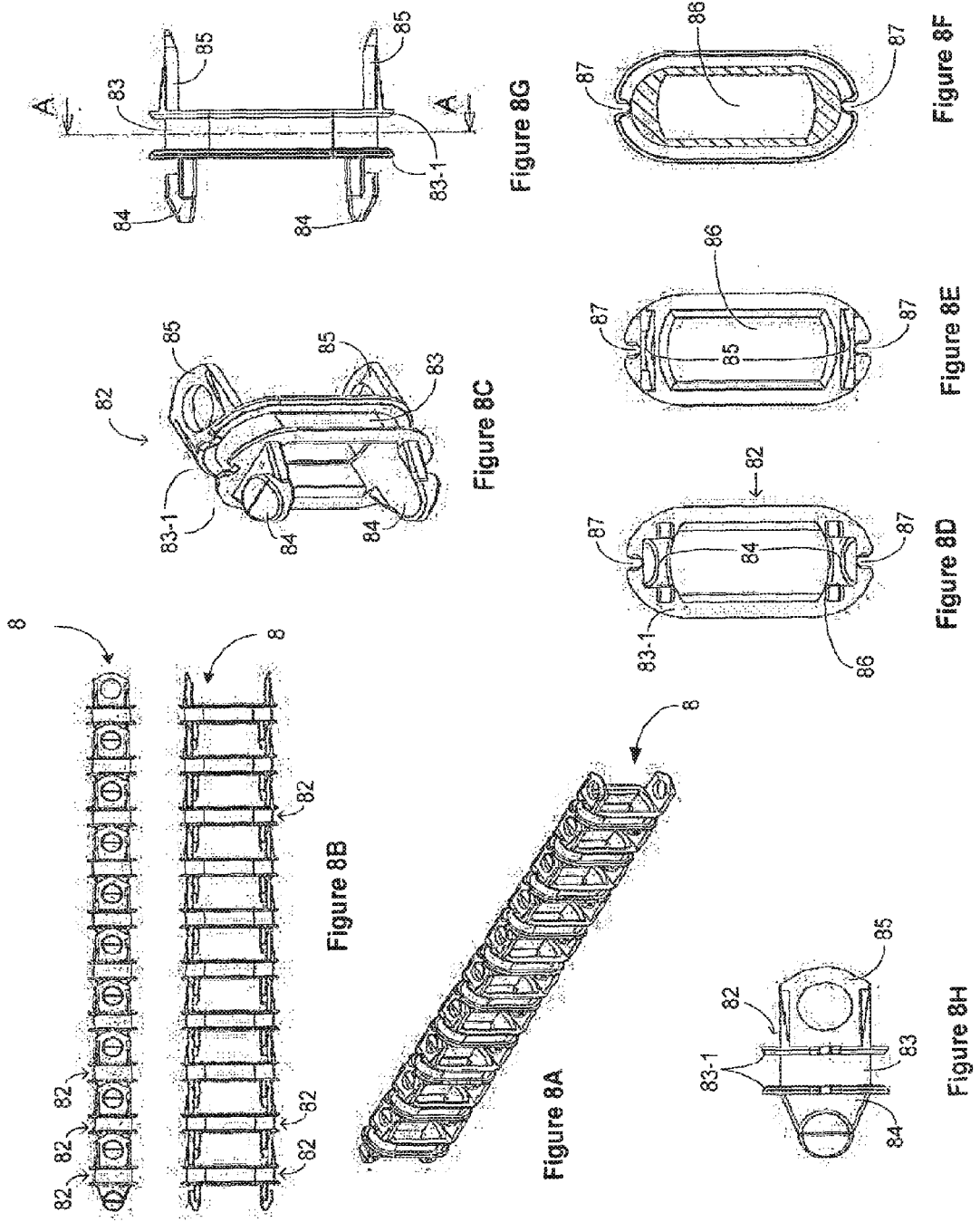

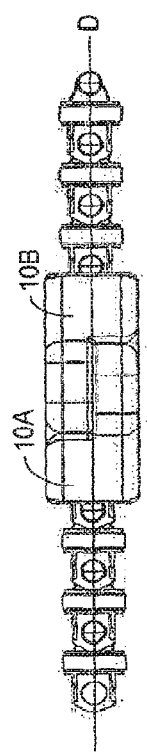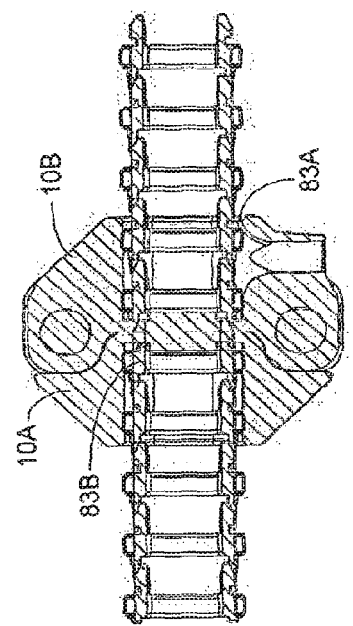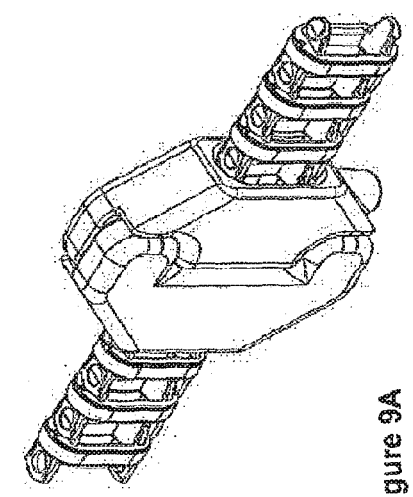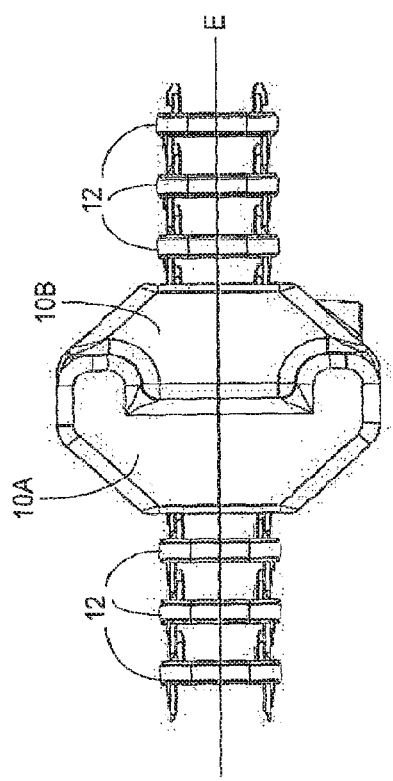

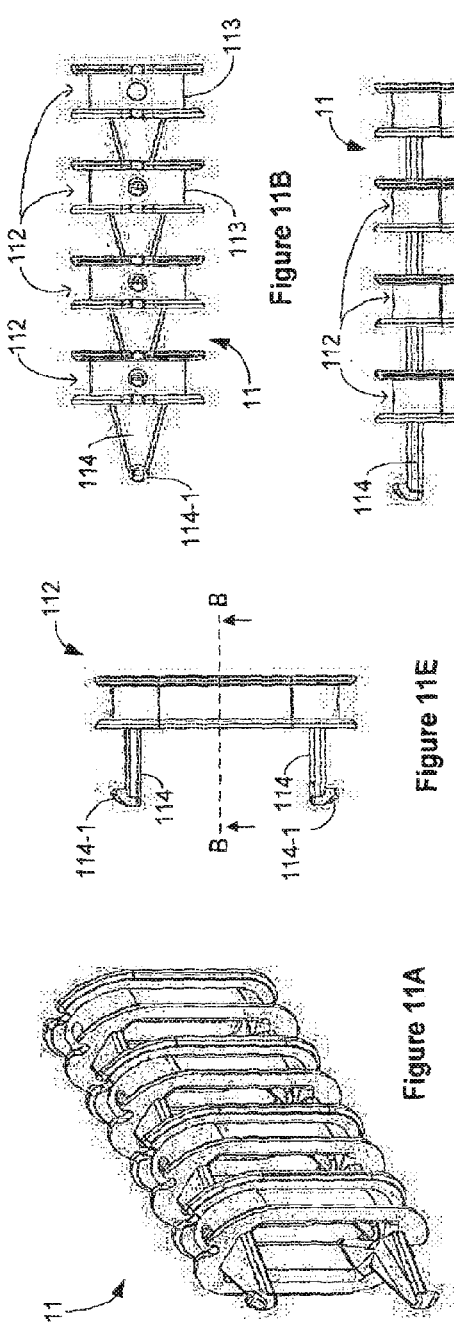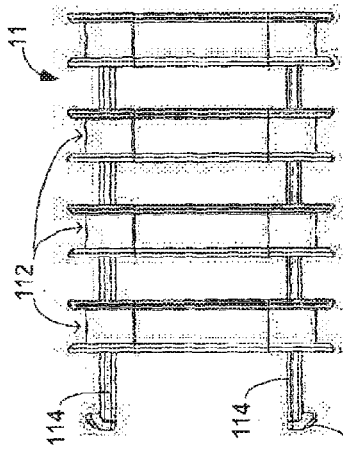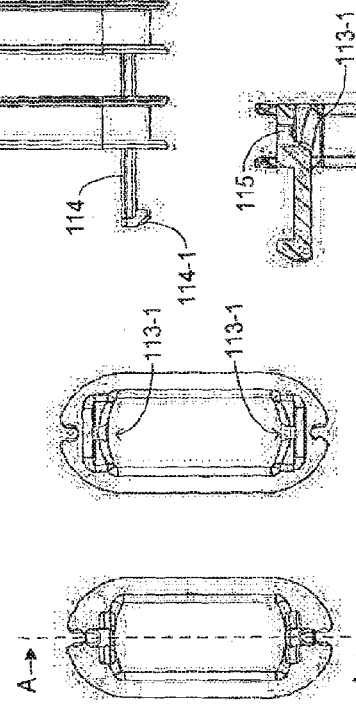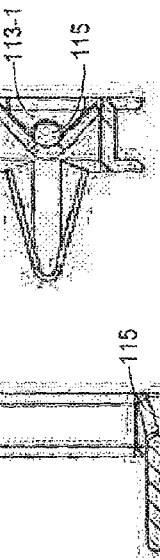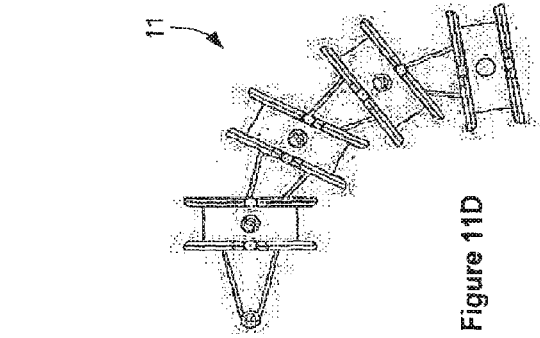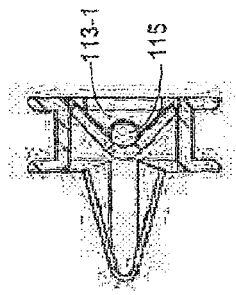

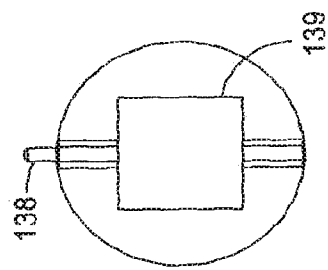
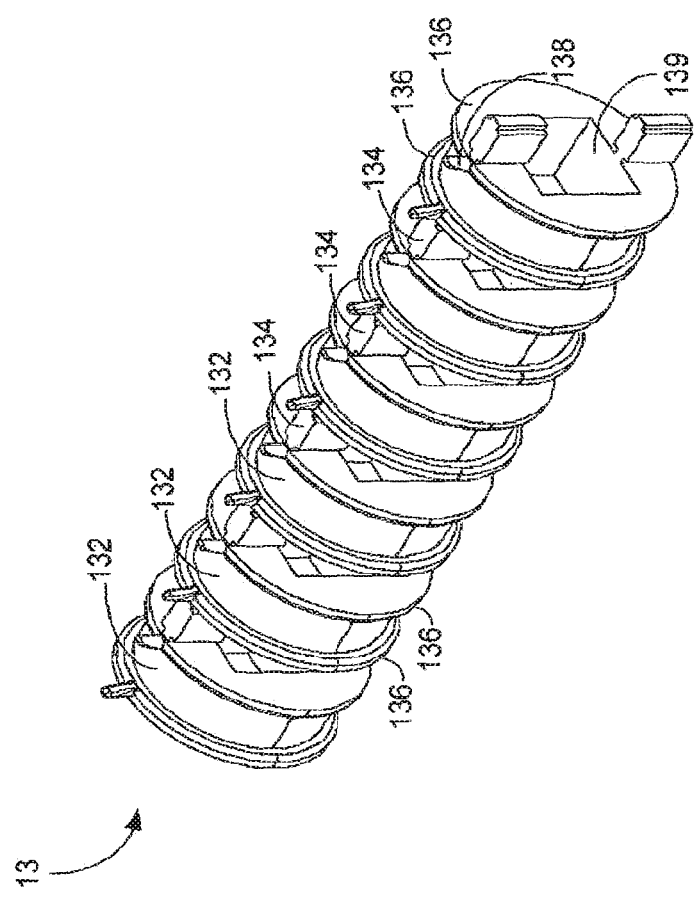
Figure 12A
Figure 12B

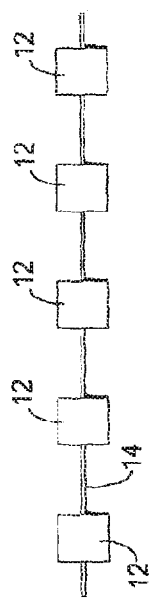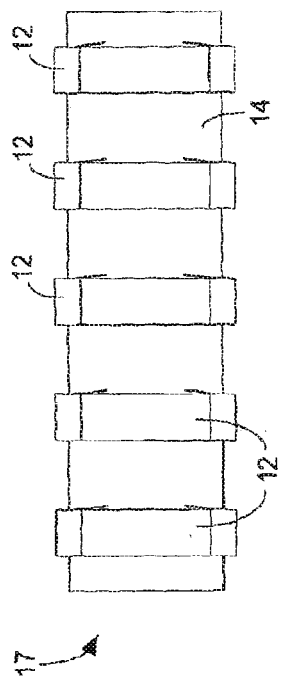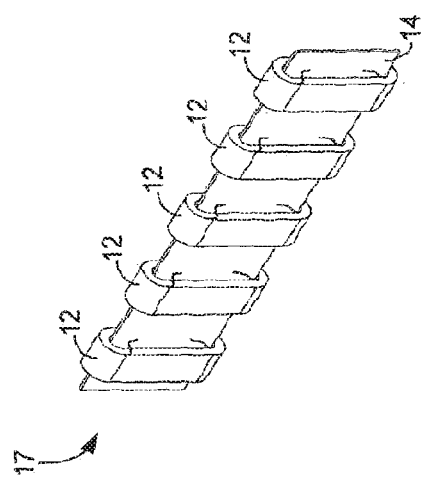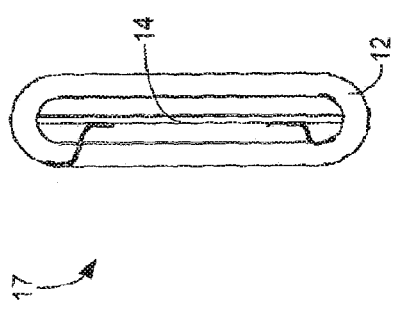

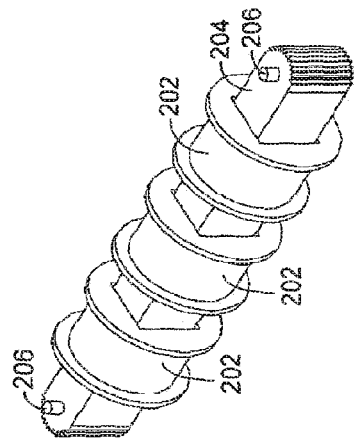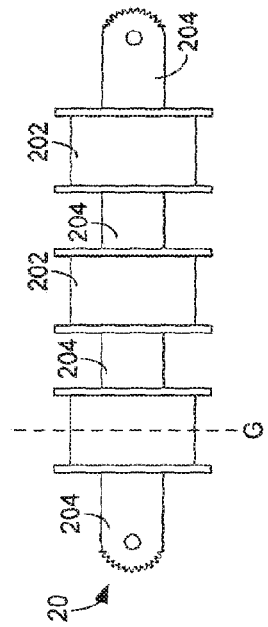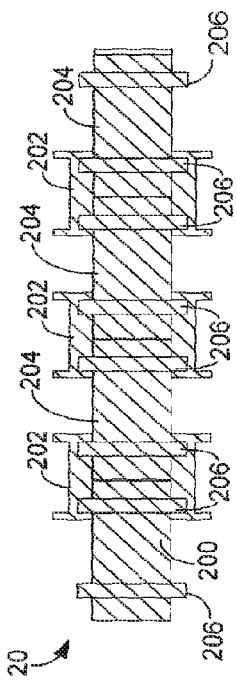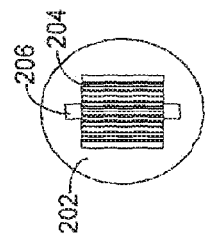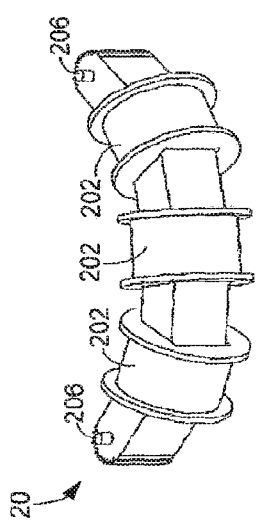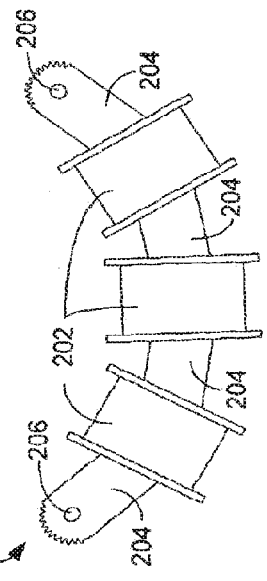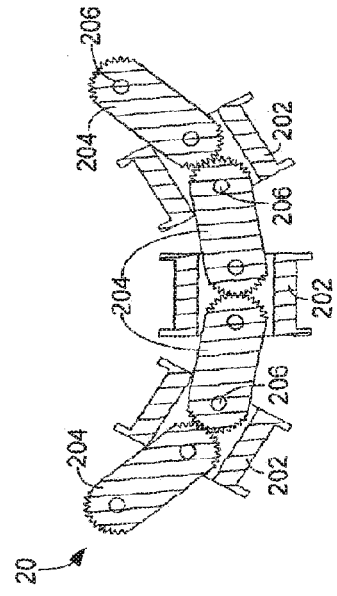

FLEXIBLE CURRENT SENSOR ARRANGEMENT

FIELD

The invention relates to a flexible current sensor arrangement.

BACKGROUND

Flexible Rogowski coils (for example as described in U.S. Pat. No. 3,434,052) provide a convenient way of obtaining AC current measurements in hard to access or temporary current monitoring situations. In terms of accuracy they suffer from the ability to make a uniform and flexible solenoid to high precision, limiting uniformity of calibration factor within the measurement loop, and limiting the level of rejection achieved for nearby currents outside the loop. This is especially true around point where the two ends of the flexible coil are connected because space has to be allocated for insulation and mechanical clamping arrangements. Another undesired feature is the difficulty of obtaining good thermal stability in view of the flexibility of the materials defining the cross section of the coils, and the length of the loop, both of which directly affect the sensitivity of the current measurement.

SUMMARY

In a first aspect, this specification describes a flexible current sensor arrangement comprising a plurality of discrete current sensing elements distributed along an elongate flexible carrier. The discrete sensing elements may comprise coils of conductive material deposited on to planar circuit boards. The discrete sensing elements may comprise a plurality of turns of conductive material wound about the elongate flexible carrier. The discrete sensing elements may comprise turns of wire wound around a spools, the spools being distributed along the carrier. The discrete current sensing elements may be electrically connected in series to one another by connecting elements. The connecting elements are arranged such that they do not significantly (or at all) increase the sensitivity of the sensor arrangement. Put another way, in embodiments in which each current sensing element comprises a coil of electrically conductive material, the connecting elements do not add additional "loop area" to the coils.

A cross-section of each sensing element may have an uneven aspect ratio. Each sensing element is configured such that it exhibits zero sensitivity to uniform magnetic fields that are parallel to a plane of the sensor. This plane is referred to as the plane of zero sensitivity to uniform magnetic fields. The cross section of the sensing element that has the uneven aspect ratio is parallel to the plane of zero sensitivity of the sensing element. The cross section having the uneven aspect ratio may be a cross-section through which the elongate flexible carrier passes.

The elongate flexible carrier may be configured such that it has a preferred axis of flexure. The elongate flexible carrier may be configured such that is has a single axis of flexure. The flexibility of the elongate flexible carrier in the preferred axis of flexure may asymmetric.

The flexible current sensor arrangement may be configurable into an openable loop. When the arrangement is configured in a loop, opposing ends of the flexible carrier may lie in the same plane as the remainder of the carrier.

The discrete sensing elements may be substantially equidistantly spaced along the elongate flexible carrier.

The flexible current sensor arrangement may comprise: a first connector element at a first end of the elongate flexible carrier; and a second connector element at a second end of the elongate flexible carrier, the first and second connector elements being configured to engage releasably with one another to form the sensor arrangement into a closed loop, wherein the discrete sensing elements are equidistantly spaced around the closed loop. Put another way, the first and second connector elements may be configured such that, when engaged with one another, the sensing elements at either end of the carrier are spaced apart by the same distance as the other equidistantly spaced sensing elements.

The elongate flexible carrier may pass through a central region of each of the current sensing elements.

The flexible current sensor arrangement may be configured such that the plane of zero sensitivity of each sensing element is substantially locally perpendicular to the longitudinal axis of a portion of the carrier on which it is carried.

The elongate flexible carrier may comprise a plurality of linked carrier portions, each of the carrier portions being configured to receive at least one current sensing element.

Each of the carrier portions may comprise a spool part for receiving one of the discrete sensing elements. The discrete sensing elements may comprise a plurality of turns of copper wire wound around the spool part. The plurality of linked carrier portions may be linked to one another by hinge portions. The plurality of linked carrier portions may detachably linked to one another by the hinge portions. The hinge portions may be configured so as to minimise a change in separation of centres of adjacent sensor elements as the elements rotate about the hinge portions. The hinge portions may be offset towards a preferred direction of flexure of the flexible elongate carrier.

The discrete current sensing elements may comprise circuit boards coils centrally mounted on the elongate flexible carrier.

In a second aspect, this specification describes an elongate flexible member for a current sensor arrangement, the elongate flexible member comprising a plurality of carrying portions linked to one another by hinge portions, each carrying portion being configured for receiving a discrete current sensing element.

In a third aspect, this specification describes a method of manufacturing a flexible current sensor arrangement, the method comprising: providing an elongate flexible carrier; and distributing a plurality of discrete sensing elements along the elongate flexible carrier.

BRIEF DESCRIPTION OF THE FIGURES

For a more complete understanding of embodiments of the present invention, reference is now made to the following description taken in connection with the accompanying drawings in which:

FIGS. 1A to 1E are schematic illustrations of various aspects of a flexible current sensor arrangement according to the invention;

FIGS. 2A to 2D are schematic illustrations of various aspects an alternative flexible current sensor arrangement according to the invention;

FIGS. 4A to 4F illustrate various aspects of an elongate flexible carrier that may be used to form a flexible sensor arrangement which is similar to that described with reference to FIGS. 1A to 1E;

FIGS. 8A to 8H illustrate various aspects of an alternative elongate flexible carrier that may be used to form a flexible sensor arrangement which is similar to that described with reference to FIGS. 1A to 1E;

FIGS. 9A to 9E show the elongate flexible carrier of FIGS. 8A to 8H used in conjunction with the connection mechanism described with reference to FIGS. 1A to 1E;

FIGS. 11A to 11I illustrate aspects of an alternative variant of the elongate flexible carrier of FIGS. 8A to 8H;

FIGS. 12A and 12B illustrate aspects of a variant of the elongate flexible carrier described with reference to FIGS. 4A to 4F;

FIGS. 14A to 14D illustrate aspects of a variant of the flexible current sensor arrangement of FIGS. 1A to 1E;

FIGS. 16A to 16G illustrate aspects of another alternative elongate flexible carrier.

DETAILED DESCRIPTION OF EMBODIMENTS

Figure 3:
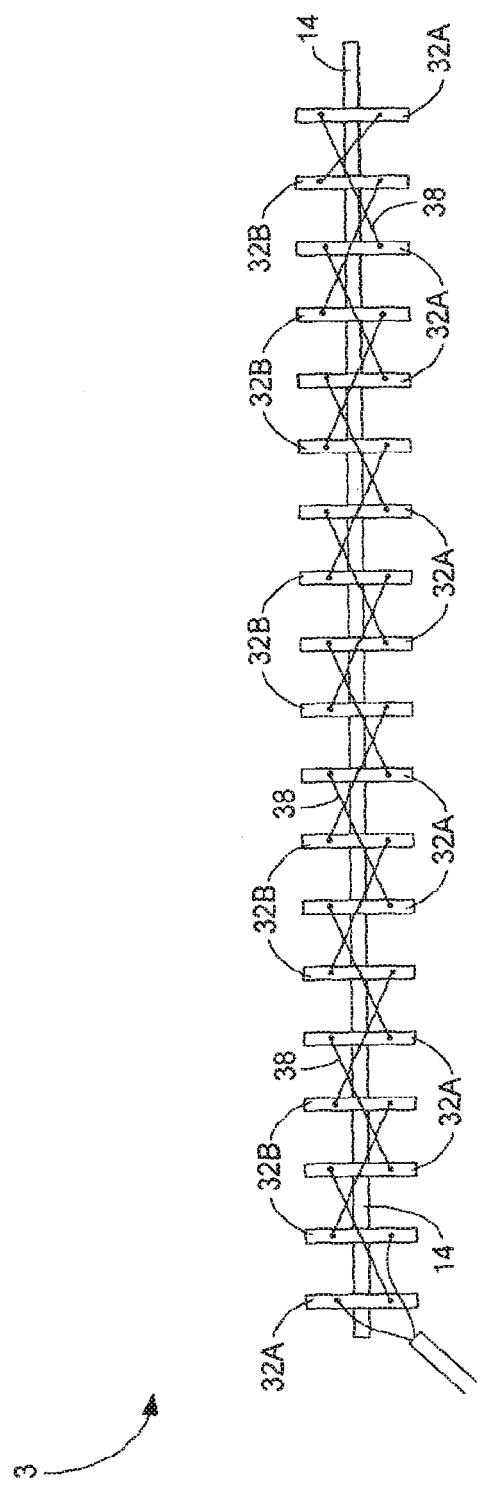
FIG. 3 is a schematic illustration of a variant of the flexible current sensor arrangement of FIGS. 2A to 2D.

In the description and drawings, like reference numerals refer to like elements throughout.

FIG. 1A to 1E are schematic illustrations of various aspects of a flexible current sensor arrangement 1 according to the invention. The flexible current sensor arrangement 1 is configurable into a closed loop. When in use, the flexible current sensor is formed into a closed loop surrounding a conductor (such as in an electrical substation) in which the current is required to be sensed.

FIGS. 1A and 1B are a side-view and a plan-view respectively of the arrangement 1 when in its open form and FIG. 1C is a plan-view of the arrangement 1 when configured into its closed loop form. FIG. 1D is a schematic cross-sectional view through a connection mechanism 10A, 10B of the arrangement 1 when in its closed form. FIG. 1E is a cross-sectional view through a discrete sensing element 12 of the arrangement 1.

The flexible current sensor arrangement 1 according to the invention comprises a plurality of discrete current sensing elements 12 distributed, or spaced, along an elongate flexible carrier 14. The discrete current sensing elements 12 are uniformly spaced along a length of the flexible carrier 14. The plurality of discrete current sensing elements 12 may be referred to as a string.

The discrete current sensing elements 12 each comprise plural turns of conductive material. In the example of FIG. 1, the discrete current sensing elements 12 comprise coils of copper wire. However, as will be appreciated from other embodiments, the discrete current sensing elements 12 may instead comprise, for example, plural turns of conductive material printed into a printed circuit board (PCB). In other examples, the sensing elements 12 may comprise pre-wound coils provided on bobbins or self-supporting cores. Each of the discrete sensing elements 12 is substantially identical to each of the other sensing elements 12. In addition the direction of winding of the each of the sensing elements 12 are the same. As such, the currents that are induced in each of the sensing elements 12 by a varying circular magnetic field (such as would be caused by an AC current travelling in a wire) sum with one another.

The discrete current sensing elements 12 are configured such that they are non-sensitive to uniform magnetic fields which are parallel to a particular plane. This plane will hereafter be referred to as the plane of zero-sensitivity to uniform magnetic fields. The plane of zero sensitivity to uniform magnetic fields for one of the discrete sensing elements 12 is shown in FIGS. 1A and 1B by the dashed line denoted by the reference numeral A. This configuration is achieved by providing all of the turns of conductive material of the sensing element in the same plane, or in planes which are substantially parallel to one another. The plane in which the turns are provided (or to which the turns are parallel) is also the plane of zero-sensitivity to uniform magnetic fields of the sensing elements 12.

The flexible current sensor arrangement 1 is configured such that the plane of zero sensitivity of each sensing element 1 is substantially perpendicular to the longitudinal axis of a portion of the carrier on which it is carried.

In this example, the discrete sensing elements 12 are configured such that the aspect ratio of a cross-section through the plane of zero-sensitivity is uneven This can be seen in FIG. 1E, in which the height of the discrete sensing element 12 (denoted "y") is longer than the width (denoted "x") of the sensing element 12. In some examples, such as those depicting in the Figures, the cross-sectional shape of the discrete sensing elements 12 is substantially rectangular. This allows the thickness of the flexible sensor arrangement 1 to be relatively low (such that the arrangement can be thread onto fixed conductors through small gaps), without detriment to the coil-area of the discrete sensing elements 12. In other examples, the discrete sensing elements 12 may have an equal cross-sectional aspect ratio.

The discrete sensing elements 12 are distributed on the flexible elongate carrier 14 such that their planes of zero sensitivity are substantially perpendicular to the longitudinal axis of the portion of the carrier at which the sensing element is provided. In the example of FIGS. 1A to 1D and in the examples of FIGS. 2 to 11, the elongate flexible carrier 14 passes through a central region of the discrete sensing elements 12. In examples in which the discrete sensing elements 12 comprise coils of wire, the wire may be said to be wound around the elongate flexible carrier 14. This may be achieved by pre-forming the coils of wire and then subsequently threading the elongate flexible carrier through the central region 12A of the coil or alternatively by winding the coils directly onto the elongate flexible carrier 14.

The discrete sensing elements 12 are electrically connected in series with one another. The discrete sensing elements 12 are electrically connected to one another by electrical connection elements 18. In examples in which the elongate carrier 14 is threaded through the discrete sensing elements 12 or in which the discrete sensing elements 12 are wound individually onto the carrier 14, the discrete sensing elements 12 may be electrically connected to one another after being threaded or wound on to the carrier 14. In other examples, such as when plural discrete sensing elements 12 are wound onto to the carrier from a single length of conductive material, the discrete sensing elements 12 do not require subsequent electrical connection to one another.

The electrical connection elements 18 are arranged such that they do not significantly affect the sensitivity of the sensor arrangement 1. Put another way, in embodiments in which each current sensing element 12 comprises plural turns of electrically conductive material, the connecting elements 18 do not add additional "loop area" to the sensing elements 12. This may be achieved by providing the electrical connecting elements 18 such that they are substantially parallel to the longitudinal axis of the elongate carrier 12. As such, even though a plurality of the discrete sensing elements 12 may be formed of a single length of wire, the sensing elements 12 can be said to be discrete in that only the sensing elements 12, and not the connecting elements 18, have an effect on the sensitivity of the arrangement. In contrast, in sensor arrangements such as that of U.S. Pat. No. 3,434,052, the whole length of the solenoid contributes to the sensitivity of the arrangement.

The electrical connection elements 18 have substantially no effect on the sensitivity of the arrangement 1 to external magnetic fields because the sensitivity of each connecting element 18 to such fields is cancelled out by the sensitivity of a connecting element on the opposite side of the closed loop.

The elongate flexible carrier 14 is stable and preferably has a high modulus along its length. This avoids the sensor being stretched during installation or handling, or changing its length over time. In addition, the elongate flexible carrier 14 has a low thermal coefficient along its length. Ideally, the thermal coefficient of the elongate flexible carrier 14 is twice that of the linear temperature coefficient discrete sensing elements 12.

The elongate flexible carrier 14 is configured such that it has a preferred axis of flexure. Put another way, less force may be required to bend the elongate carrier 14 in the preferred axis than to bend the elongate carrier 14 in the non-preferred axis. In some embodiments, the elongate flexible member is capable of bending in only one axis. In the example of FIG. 1A, the preferred axis of flexure is parallel to the page. In FIG. 1B, the preferred axis of flexure is perpendicular to the page. Preferably, elongate carrier 14 is capable of only a limited amount of twist.

In the example of FIGS. 1A to 1E, the elongate flexible carrier 14 comprises a substantially flat strip of flexible material. As such, the length and width of the carrier 14 are significantly larger than the thickness of the carrier. Suitable materials for a flat flexible carrier 18, such as that of FIG. 1A to 1E, include thin PCB material (e.g. thin $FR_4$ or polyamide), non-magnetic metallic spring strip (e.g. full hard beryllium copper strip). In some examples, the carrier 14 may be constructed of plural layers of material. For example, the carrier 14 may comprise two layers of rubber with fibre reinforcement between the two layers of rubber. The fibre reinforcement may comprise, for example, glass, polyamide, carbon or HDPE. Ideally, the fibres are optimally aligned along the length of the carrier, although they may be laid in both directions. In other examples, the carrier 14 may comprise two layers of rubber with a layer of thin non-magnetic metal strip (or mesh) provided between the rubber layers.

As mentioned above, the flexible sensor arrangement 1 is configurable into a closed loop. This can be seen in FIG. 1C. The loop can be opened and closed as required to allow for the flexible sensor arrangement 1 to be fitted around and removed from fixed conductors. This is achieved by providing first and second loop connector elements 10A, 10B of a connection mechanism at respective ends of the elongate flexible carrier 14. The first and second loop connector elements 10A, 10B are configured to detachably connect, or engage, with one another. The first and second loop connector elements 10A, 10B have corresponding shapes such that they fit together with one another. More specifically, a first of the loop connector elements 10B includes at least one protuberance 10B-1 and a second of the loop connector elements 10A includes a corresponding number of apertures 10A-1 into which the at least one protuberance 10B-1 is received. Preferably, the connection mechanism includes at least two protuberances 10B-1 and at least two corresponding apertures 10A-1. This restricts the amount by which the first and second loop connector elements 10A, 10B are able to rotate with respect to one another. In the example of FIGS. 1A to 1E, the loop connection mechanism 10A, 10B comprises two protuberances 10B-1 and two corresponding apertures 10A-1. The dimensions of the protuberances 10B-1 and corresponding apertures 10A-1 are such that the friction between the loop connector elements 10A, 10B maintains the elements in their connected state until they are forcibly separated. In some examples, the loop connector elements 10A, 10B may include an additional locking mechanism (not shown) to ensure the loop connector elements 10A, 10B do not become disengaged from one another until such is required.

FIG. 1D is a schematic cross section through the connection mechanism 10A, 10B when the loop connection elements 10A, 10B are connected to one another. The first and second loop connector elements 10A, 10B are configured such that, when they are connected, the distance between the sensing elements 12B, 12C at each end of the carrier 14 is substantially, and preferably exactly, the same as the distance between each sensing element 12 on the carrier 14 and its immediate neighbour(s). In addition, the loop connection mechanism 10A, 10B is configured such that, when connected to form the loop, all of the discrete sensing elements 12 in the loop are provided in the single plane. In the example, shown in FIG. 1C, these characteristics are achieved by receiving the ends of the carrier 14, and also the sensing elements 12B, 12C provided thereon, within apertures 10A-2, 10B-2 formed in loop connector elements 10A, 10B. The sensing elements 12B, 12C received in the apertures 10A-2, 10B-2 abut an end wall of their respective aperture 10A-2, 10B-2. The thickness of the end wall is half of the spacing between adjacent sensing elements 12B, 12C. The loop connector elements 10A, 10B are configured such that, when they are connected, the end walls of the apertures 10A-2, 10B-2 abut one another.

The flexible current sensor arrangement 1 comprises an output cable 16 which includes first and second signal-carrying wires 16A, 16B. In the example of FIGS. 1A to 1E, the output cable projects from a one of the loop connector elements 10A. A first of the signal carrying wires 16A is directly electrically connected to a first of the discrete sensing elements 12B. The second signal carrying wire 16B is directly electrically connected to a last of the discrete sensing elements 12B. Here "first" and "last" refers to electrical position rather than physical position in the string of series-connected sensing elements 18. Put another way, the first and last sensing elements 12B, 12C in the string are those which are directly electrically connected with only one other sensing element 12. In the example of FIGS. 1A to 1D, the first and last sensing elements 12B, 12C are those received in the loop connection elements 10A, 10B. As shown schematically in FIG. 1D, a return electrical connecting element 18A directly electrically connects the last sensing element 12C in the string of sensing elements 12 with the output cable 16.

Although, in the example of FIGS. 1A to 1E, the elongate flexible carrier 14 comprises a flat strip of flexible material, it will be appreciated that the flat strip of material may be replaced by any of the elongate flexible carriers described below with reference to FIGS. 4 to 11.

FIGS. 2A to 2D are schematic illustrations of various aspects an alternative current sensor arrangement 2 in accordance with examples of the invention. Many of the properties of the sensor arrangement 2 of FIGS. 2A to 2D are substantially the same as those of the sensor arrangement 2 described with reference to FIGS. 1A to 1E. As such, not all of these properties will be described again with reference to FIGS. 2A to 2D. Instead, the below description will concentrate primarily on the differences between the two sensor arrangements. FIGS. 2A and 2B show a side-view and a plan-view of the flexible current sensor arrangement 2. FIGS. 2C and 2D are plan views of opposing faces of a discrete sensor element 22 of the arrangement 2.

In the example of FIGS. 2A to 2D, the discrete sensing elements 22 comprise a conductive track 22A formed of a plurality of turns of conductive material deposited onto a planar PCB 22B. As with the arrangement 1 described with reference to FIGS. 1A to 1E, the sensing elements 22 of FIG. 2 are equidistantly spaced along the carrier 14. The carrier 1 is substantially as described with reference to FIGS. 1A to 1D.

In the example of FIGS. 2A to 2D, the conductive track 22A is provided on both sides of the PCB 22B. The conductive tracks 22A on either side of the PCB 22B are connected by a via 22C. The turns of the conductive tracks 22A on either side of the PCB 22B are oppositely wound. As such, the signals induced in the tracks 22A on either side of the PCB 22B by a changing magnetic field perpendicular to the plane of the tracks 22A sum positively.

As in the example of the FIGS. 1A to 1E, the elongate flexible carrier 14 passes through a central region 22D of the discrete sensing element 22. In this example, the central region 22D is in the form of a slot. Also, the aspect ratio of the turns of conductive material is uneven. The dimension of the PCB 22B in the direction of preferred bend or flex of the carrier is smaller than the dimension in the perpendicular direction. This allows the sensor to be inserted through smaller gaps. In addition, this minimises the effect on the sensitivity inside and outside the loop of varying the shape of the loop.

The PCB includes two projections 22B-1, 22B-2 to which the electrical connection elements 28 for electrically connecting the discrete sensing elements 22 in series can be attached. In this example, the projections 22B-1, 22B-2 project outwardly from an end edge of the PCB 22B. Opposite ends of the conductive material of the sensing element 22 are in direct electrical connection with the different ones of the projections. In this example, the projections 22B-1, 22B-2 are notched so as to allow the electrical connection elements 28, to be more easily physically connected to the projections 22B-1, 22B-2.

As can be seen in FIGS. 2C and 2D, the projections 22B-1, 22B-2 are spaced apart. This allows the return connecting element 28A, which directly electrically connects the last sensing element 22 in the string (in this example at the right-hand end of FIG. 2A) to the output cable 16, to be passed through a region between the projections 22B-1, 22B-2. As such, the return connecting element wire 28A does not interfere with the electrical connection elements 28 which connect the discrete sensing elements 22 in series.

Although not shown in FIGS. 2A to 2D, this example arrangement 2 also includes a connection mechanism, which is configured similarly to that of FIGS. 1 to 1D to separate the first and last sensing elements in the arrangement by the spacing distance of the other sensing elements 22 in the string.

In one specific example, the properties of the various parts of the flexible sensor arrangement 2 may be as follows:
  Conductive track 22A outer dimensions=9.5 mm×24 mm;
  Conductive track 22A width=0.15 mm;
  10 turns of conductive track on each side of the PCB 22B;
  Central region/inner slot dimensions=1.6 mm×14 mm;
  53 discrete sensing elements 22 spaced along the elongate flexible carrier with a 4.4 mm separation;
  Elongate flexible carrier material=fibre reinforced rubber laminate;
  Dimensions of elongate flexible carrier=1.6 mm×14 mm×233 mm;

A flexible sensor arrangement 1 configured in this way achieves a sensitivity of 0.25 mV/Amp at 50 hz.

FIG. 3 shows a sensor arrangement 3 that is similar to that of FIGS. 2A to 2D. The main difference is the discrete sensors elements are connected differently. More specifically, each sensing element is not directly electrically connected to the adjacent element, but to the next but one sensing element 32A, 32B. The discrete sensing elements 32A, 3B of FIG. 3 may still be considered as a single series-connected string. However, in this example, the string is effectively folded in half. One advantage of this arrangement 3 is that no return wire, from one end of the elongate carrier 14 to the other, is required. Another advantage is that capacitive coupling from a cable is largely equally coupled to sensing elements close to the positive and negative output, thereby reducing the need for an electrostatic screen around the sensor.

FIGS. 4A to 4F show various aspects of an elongate flexible carrier 4 that may form part of a sensor arrangement which is similar to that described with reference to FIG. 1A to 1E. FIGS. 4A, 4B and 4C are a plan-view, a side-view and a perspective view respectively of the elongate flexible carrier 4. FIGS. 4D and 4E are cross-sectional views through the carrier 4. FIG. 4F is an enlarged plan view of a hinge portion of the carrier 4. The discrete sensor elements and the electrical connecting elements are not shown on FIGS. 4A to 4F. However, these may be substantially as described with reference to FIGS. 1A to 1E.

The elongate flexible carrier 4 comprises a plurality of discrete sensing element carrying portions 42. In this example, the plurality of discrete sensing element carrying portions 42 each comprise a spool 42 about which conductive wire (not shown in FIG. 4) can be wound to form a discrete sensing element. The wire used to form the sensing elements is insulated. The carrying portions 42 comprise flanges 46 at either end thereof. These ensure that the conductive wire is retained on the carrying portion 42. The carrying portions 42 are uniformly spaced along the length of the carrier 4. The discrete sensing element carrying portions 42 each have an uneven aspect ratio (as can be seen in FIG. 4D, which is a cross-section through the dashed line marked A' on FIGS. 4A and 4B). Consequently, when the conductive wire is wound onto the carrying portion 42, the resulting discrete sensing elements also have an uneven aspect ratio.

In one specific example, the carrying portions 42 are configured such that the discrete sensing elements are 2 mm wide and have two layers of windings. When using 0.1 mm enamelled copper wire, this results in 40 turns per discrete sensing element.

Each of the plurality of discrete sensing element carrying portions 42 is coupled to at least one other of the carrying portions 42 by a hinge portion 44. The hinge portions are permanently coupled to the carrying portions. As such, in this example, adjacent carrying portions 42 cannot be detached from one another without breaking the carrier 4. The hinge portions are aligned with one another. The hinge portions 42 are configured so as to allow the carrying portions to rotate relative to one another, thereby allowing the elongate flexible carrier to bend. The hinge portion 44 comprises first and second hinges 44A, 44B. The first and second hinge portions 44A 44B are oppositely disposed across the longitudinal axis of the elongate carrier 4. This causes the elongate flexible carrier 4 to be flexible in only one axis. The carrying portions 42 are stiff compared to the hinge portions 44. As such, the elongate flexible carrier 4 bends at the hinge portion 44 and not at the carrying portion 42. Although the example of FIGS. 4A to 4F include two hinges 44A and 44B, in some examples the carrying portion s may be connected by a single hinge portion.

Each of the carrying portions 42 includes two pairs of projections 48A, 48B on each side thereof. The projections on each side of the carrying portion extend towards the adjacent carrying portion 42. The pairs of projections 48A, 48B are disposed on opposite sides of the longitudinal axis of the carrier 4 from one another. The pairs of projections 48A, 48B are disposed on opposite sides of the hinge 44A, 44B portions from one another. The projections 44A, 44B are configured to restrict the amount by which adjacent carriers 4 are able to rotate about the hinge portion 44. This is because, once the angle of rotation reaches a particular angle, the projections of a particular pair 48A, 48B on adjacent carrying portions 42 come into physical contact, thereby restricting further rotation.

In the example of FIGS. 4A to 4C, a first pair of projections 44B extends further from the side of the carrying portion 42 towards the adjacent carrying portion 42, than does the second pair of projections 44A. As such, the separation between the first pairs of projections 44B on adjacent carrying portions 42 is less than the separation between the second pairs of projections 44A. This can be seen clearly on FIG. 4F. Consequently, the carrier 4 is able to bend further in one direction of the axis of flexure than in the other. This reduces the likelihood of the sensor arrangement being installed incorrectly. Limiting the possible angle of rotation in the preferred direction of flexure means that the change in centre-to-centre separation of the discrete sensing elements can be minimised. In one specific embodiment, the bend angle in the preferred direction of flexure may be limited to 20° and to 5° in the opposite direction.

As can be seen in FIG. 4F, each of the hinges 44A, 44B comprises a thicker portion 44A-1 appended at either end by a thinner portion 44A-2. The hinges 44A, 44B are connected to the carrying portions 42 at either end by the thinner portions of the 44A-2 of the hinge. This means that the hinges are more flexible at the connection with the carrying portion that at the middle of the hinge. Consequently, the effective pivot points of each hinge are shifted towards the carrying portions 42, and so also towards a centre of the discrete sensing elements provided thereon. This reduces change in distance between the centres of the sensing elements as the carrying portions 42 rotate about their hinges. This improves the performance of the sensor arrangement.

Also, as can be seen in FIG. 4F, each of the hinges 44A, 44B is shifted from the centre of the carrying portion in the direction of preferred flexure of the elongate flexible carrier. Put another way, the hinges 44A, 44B are shifted from the longitudinal axis towards the second pairs of projections 44A (which extend less far from the carrying portion than do the first pairs of projections 44B). This serves to maintain the centre-to-centre separation of each of the discrete sensing elements closer to a constant value, on average. This can be seen from FIG. 5.

Figure 5:
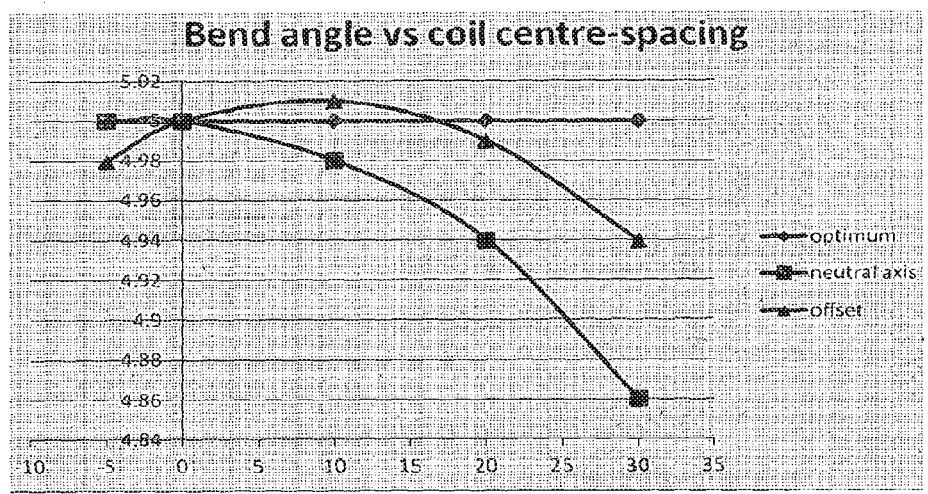
FIG. 5 is a graph illustrating an aspect of the elongate flexible carrier of FIGS. 4A to 4F.

FIG. 5 is a graph of angle of rotation of adjacent carrying portions 42 (on the x-axis) versus centre-to-centre separation of the carrying portions, and so also the centre-to-centre separation of the discrete sensing elements carried thereon. The flat curve (with rhombus-shaped points) shows the ideal situation in which the centre-to-centre separation does not change with angle of rotation. The steep curve (with square-shaped points) shows the change in centre-to-centre separation when the hinge is aligned with the longitudinal axis of the carrier. The final curve (with the triangular-shaped points) shows the change in centre-to-centre separation with an offset hinge, as shown in FIG. 4F. It can thus be seen that an offset hinge results in a centre-to-centre separation that is closer to the ideal value over a wider range of angles than does the central (or neutral) hinge.

Returning now to FIGS. 4A to 4F, each carrying portion 42 includes a peg or guide 49 projecting therefrom. In this specific example, the guides 49 project from each flange 46. As such, each carrying portion 42 comprises a pair of guides 49. These serve as guides for the electrical connecting elements (not shown) as they pass from one discrete sensing element to the other. The guides 49 on each flange are oppositely disposed to one another in a direction that is substantially parallel to the longitudinal axis of the carrier 4. As such, the electrical connection elements are substantially parallel to the longitudinal axis of the carrier 4 and so are also perpendicular to the plane of zero sensitivity of each discrete sensor element.

Each of the carrying portions 42 include an aperture 43 formed therein. The apertures 43 combine to form a continuous longitudinal hole which runs the length of the carrier 4. As such the elongate flexible carrier 4 can be threaded on to a mandrel so as to stiffen the carrier before the conductive wire is wound on to the carrying portions to the form the discrete sensing elements.

The elongate carrier of FIG. 4 may be constructed of a mouldable plastics material such as, but not limited to, polyamide and polyacetal.

Figure 6B:
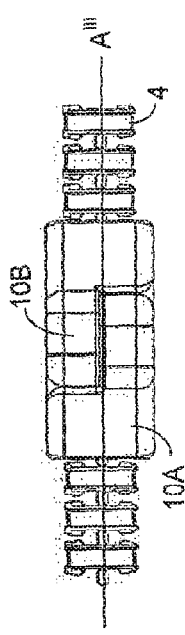
FIGS. 6A to 6E show the elongate flexible carrier of FIGS. 4A to 4F used in conjunction with the connection mechanism described with reference to FIGS. 1A to 1E.
Figure 6D:
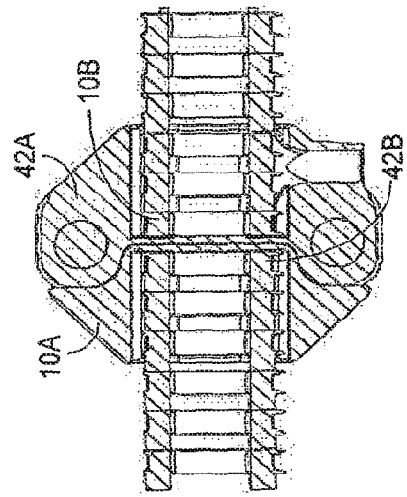
Figure 6E:
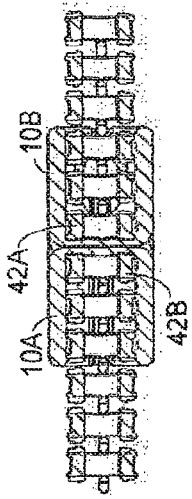
Figure 6A:
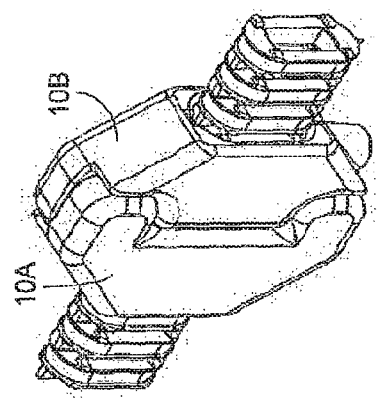
Figure 6C:
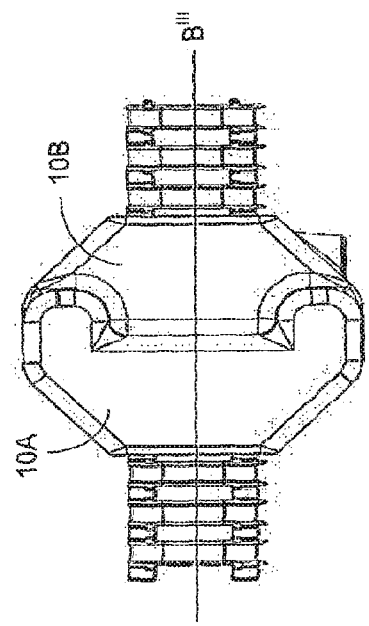

FIGS. 6A to 6E show various views of the elongate flexible carrier 4 of FIGS. 4A to 4F used in conjunction with the connection mechanism 10A, 10B as described with reference to FIG. 1. More specifically, FIGS. 6A to 6C are perspective-, plan- and side-views respectively of the connection mechanism 10. FIGS. 6D and 6E are cross-sectional views along the lines denoted A" and B" respectively.

It can be seen from FIGS. 6D and 6E that the connection mechanism 10A, 10B is configured so as maintain the carrying portions 42A, 42B at either end of the elongate flexible carrier 4 at a separation that is substantially the same as the separation between adjacent carrying portions of the elongate flexible carrier 4.

Figure 7B:
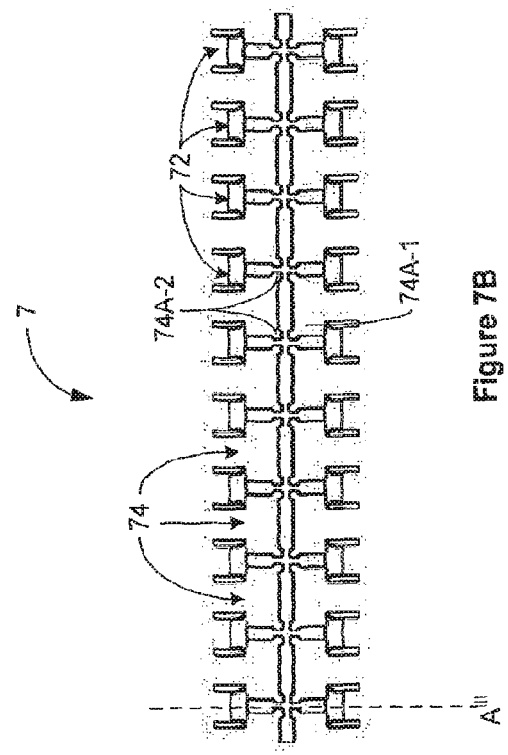
FIGS. 7A to 7D illustrate aspects of a variant of the elongate flexible carrier described with reference to FIGS. 4A to 4F.
Figure 7C:
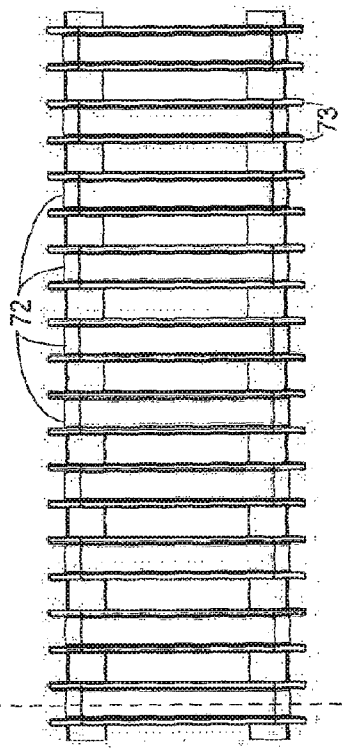
Figure 7A:
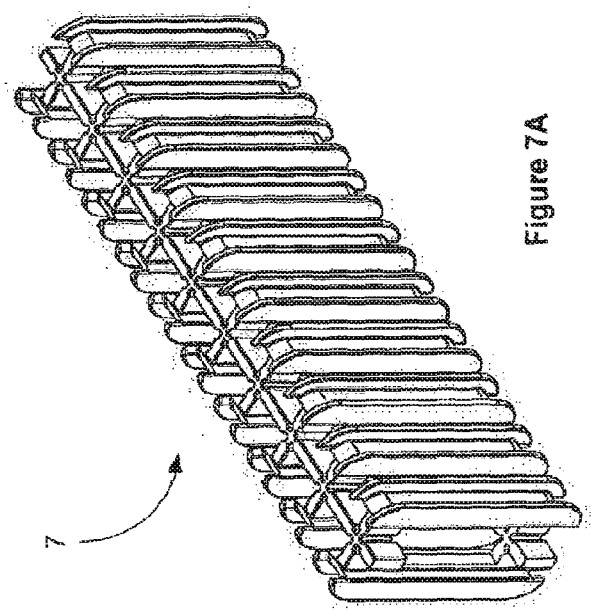
Figure 7D:
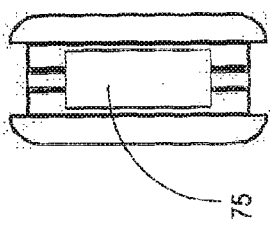

FIGS. 7A to 7D show a variation of the elongate flexible carrier 4 discussed with reference to FIGS. 4A to 4F. More specifically, FIGS. 7A to 7C show perspective-, plan- and side-views respectively of the elongate flexible carrier 7. FIG. 7D is a cross-sectional view through one of the carrying portions 72 (for example, along the dashed line marked A''').

As with the carrier 4 of FIG. 4, the elongate flexible carrier comprises a plurality of discrete sensor element carrying portions 72 each connected to at least one adjacent carrying portion 72 by a hinge portion 74. Also as with the carrier of FIG. 4, each hinge portion 74 comprises first and second hinges 74A, 74B. The first and second hinges 74A, 78B are oppositely disposed across the longitudinal axis of the elongate carrier 7. The hinges 74A, 74B comprise a thicker portion 74A-1 appended at each end by a thinner portion 74A-2. The hinges 74A, 7B are connected to the carrying portions 72 by the thinner hinge portions 74A-2. As such, the pivot points of the hinges are at either end of the hinges 74A, 74B.

In this example, the pivot points of the hinge portions 74 are located within the thickness of the carrying portions 72. Preferably, the pivot points are location as close as possible to the centre of the thickness of the carrying portions 72. This minimises the variation of the centre-to-centre separation of adjacent carrying portions (and so also of the centre-to-centre separation of the discrete sensing elements carried thereon) as the relative rotation of the adjacent carrying portions 72 change. In the example of FIGS. 7A to 7D, the hinges portions 74 may be aligned with the longitudinal axis of the elongate carrier 7 (i.e. may not be offset).

As with the carrier 4 of FIGS. 4A to 4F, the carrying portions 72 of the carrier 7 of FIGS. 7A to 7D comprise spools onto which conductive wire can be wound to form discrete sensing elements. The carrying portions 72 also comprise flanges 73 for retaining the turns of wire on the carrying portion 72. In addition, each of the carrying portions 72 includes an aperture 75 in a middle region thereof. This allows the elongate member to be threaded onto a mandrel. This facilitates the winding of the conductive wire onto the carrying portions 72 to form the discrete sensor elements.

Although not shown in FIGS. 7A to 7D, it will be appreciated that the variant of FIG. 7 may be configured to include a number of the other features described with reference to the carrier 4 of FIGS. 4A to 4F. For example, the carrier may include projections 48A, 48B for imbuing the carrier with a preferred direction of flexure. In addition or alternatively, the elongate flexible carrier 7 may include guides extending therefrom, the guides being for guiding the connecting elements from one discrete sensing element to the next.

FIGS. 8A to 8H show aspects of an alternative elongate flexible carrier 8 for use in a current sensor arrangement such as that described with reference to FIG. 1. FIG. 8A is a perspective view of the elongate flexible carrier 8. FIG. 8B shows plan and side views of the elongate flexible carrier 8. The elongate flexible carrier 8 comprises a plurality of detachable (or decouplable) discrete sensing element carrying portions 82. FIGS. 8C to 8H show various views of a single one of the detachable discrete sensing element carrying portions 82.

Each detachable carrying portion 82 comprises a spool part 83. The spool part 83 is configured to receive plural turns of conductive material (such as copper wire), thereby to form a discrete sensing element (not shown in FIGS. 7A to 7G). The spool part 83 comprises a flange 83-1 at either end. The flanges 83-1 facilitate retention of the discrete sensing elements on the spool part 83. Each of the flanges 83-1 includes at least one notch 87 for guiding the electrical connection element (not shown) from one discrete sensing element (not shown) to another.

The cross-section of the spool part 83 has an uneven aspect ratio (as can be seen in FIG. 8H). The spool part 83 includes an aperture 86. As such, when a plurality of carrying portions 82 is coupled to one another to form an elongate flexible member 8, a continuous longitudinal hole is formed though. The elongate carrier 8 can thus be threaded onto a mandrel to facilitate the winding of the coils onto the spool parts 83. As can be seen in FIGS. 8A and 8B, when a plurality of carrying elements 82 are coupled together in an aligned formation the spool parts 83 (and so also the sensing elements carried thereon) are uniformly spaced.

The detachable carrying portion 82 comprises a pair of male hinge parts 84 extending from a first end of the spool part 83. The detachable carrying portion 82 also comprises a pair of female hinge parts 85 extending from a second end of the spool part 83. Each male hinge part 84 comprises a hinge pin and each female hinge part 85 comprises a corresponding aperture for receiving the hinge pin of an adjacent detachable carrying portion. The two male hinge parts 84 of the pair are oppositely disposed across the length of the aperture 86. Similarly, two female hinge parts 85 are oppositely disposed across the length of the aperture 86. Each of the pair of male hinge parts 84 is oppositely disposed to a different one of the pair of female hinge parts 85 across the thickness (or depth) of the spool part 83.

Each of the pair of male hinge parts 84 is configured to detachably couple with one of the pair of female hinge parts 85 of an adjacent carrying portion 82, thereby to form a chain of carrying portions 82. Adjacent carrying portions 82 can be decoupled by urging each of the pair of male hinge parts 84 away from the respective female hinge part 85 to which it is coupled. In the specific example shown in FIGS. 8A to 8H, the carrying portions 82 are configured such that adjacent carrying portions 82 can be decoupled by urging the pair of male hinge parts 84 towards one another. The male and female hinge 84, 85 parts are configured such that, when coupled together, rotation of one carrying portion 82 with respect to the other is allowed in one axis only.

The at least one notch 87 in the flange 83-1 is aligned with the direction of extension of the male and female hinge parts 84, 85. In the example of FIGS. 7A to 7G, the flange comprises two oppositely disposed notches 87. This enables the each discrete carrying portion to be used in either of two orientations. This facilitates the forming of the elongate flexible carrier 8 from the plurality of separate carrying elements 82.

FIGS. 9A to 9E show various views of the elongate flexible carrier 8 of FIGS. 8A to 8H used in conjunction with the connection mechanism 10A, 10B as described with reference to FIG. 1. More specifically, FIGS. 9A to 9C are perspective-, plan- and side-views respectively of the connection mechanism 10A, 10B. FIGS. 9D and 9E are cross-sectional views along the lines denoted D and E respectively.

It can be seen from FIGS. 9D and 9E that the connection mechanism 10A, 10B is configured so as maintain the spool parts 83A, 83B at either end of the elongate flexible carrier 8 at a separation that is substantially the same as the separation between adjacent spool parts 83 of the elongate flexible carrier 8.

FIGS. 9A to 9E also show the discrete sensing elements 12 in situ on the carrying elements. The electrical connection elements between the discrete sensing elements 12 are not shown.

Figure 10A:
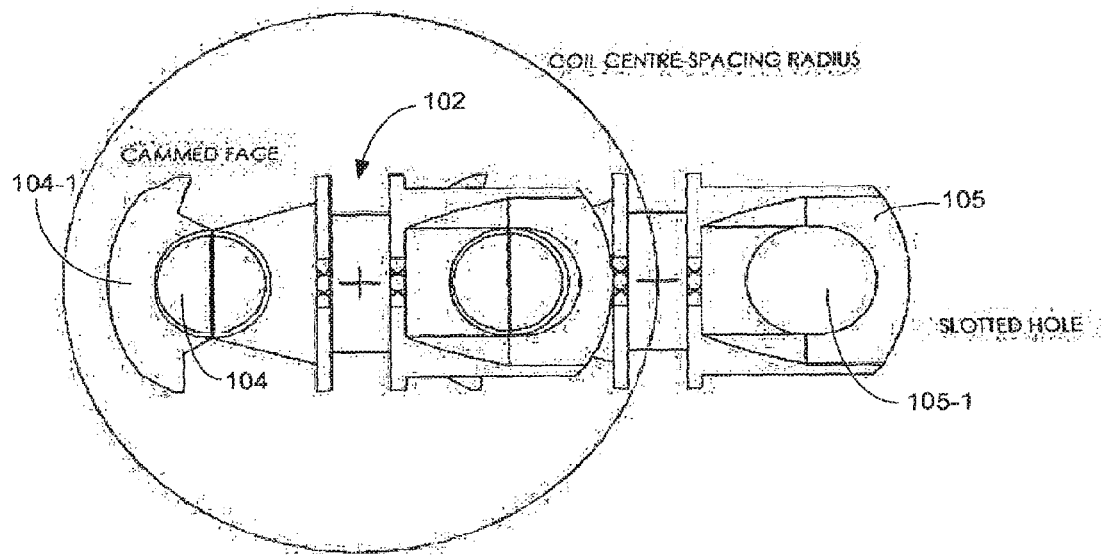
FIGS. 10 and 10B illustrate aspects of a variant of the elongate flexible carrier of FIGS. 8A to 8H.
Figure 10B:
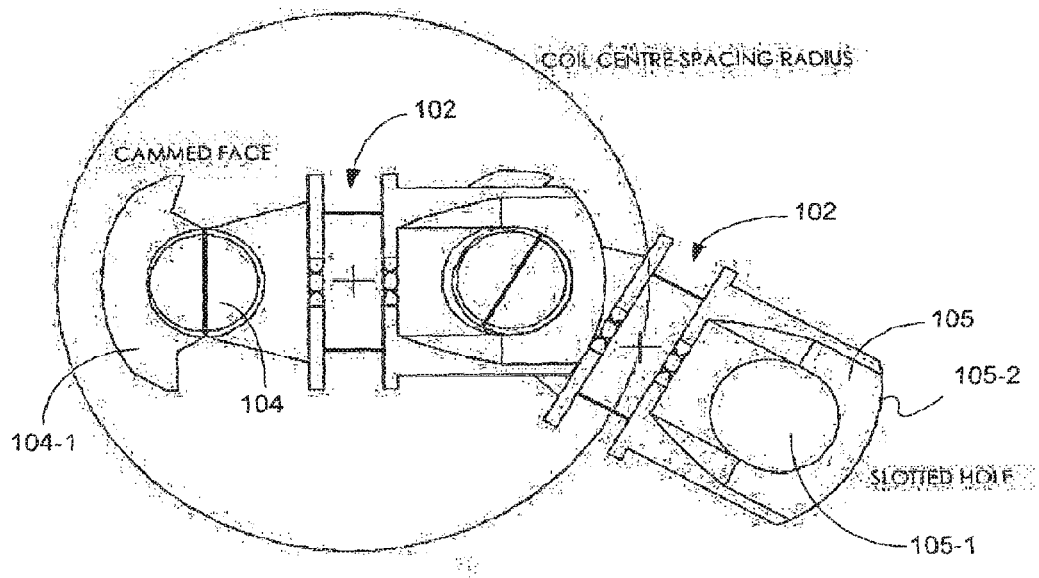

In the elongate carrier of FIGS. 8A to 8H, the centre-to-centre spacing of the discrete sensing elements varies with bend angle in a similar way to the steepest curve of FIG. 6. FIGS. 10A and 10B show a variant of the detachable sensing element carrying portions 82 described with reference to FIG. 8. The variant carrying portion 102 is substantially the same as that described with reference to FIG. 8, but is configured to maintain a constant centre-to-centre separation of the sensing elements. In the example of FIGS. 10A and 10B, this is achieved by providing the pair of female hinge parts 105 with elongate apertures 105-1 instead of circular apertures and by providing the male hinge parts 104 with a cammed face 104-1. As such, when the male hinge part 104 of one carrying portion 102 rotates relative to the female hinge part 105 of an adjacent carrying portion 102, the cammed face 104-1 causes the male hinge part 104 to slide in the elongate aperture 105-1 of the female hinge part 105, thereby maintaining the centre-to-centre separation of the discrete sensing elements. This can be seen from a comparison of FIGS. 10A and 10B. In the example of FIGS. 10A and 10B, the female hinge 105 part also includes a cammed face 105-2. In alternative examples, however, a single cammed face could be provided on just one of the male and female hinges part 104, 105. The image shows cam features on both male and female halves, although only the male cam is labelled. (MP). Although not shown in the Figures, it will be appreciated that this example may include a tensioning member (or biasing means) for urging adjacent carrying portions towards one another. In some examples, this may be provided inside the aperture. In other examples, the tensioning may be provided by an insulating sheath provided on the exterior of the arrangement.

FIGS. 11A to 11I show another variant of the elongate flexible member 8 described with reference to FIGS. 8A to 8H. FIG. 11A is a perspective view of the elongate flexible carrier 11. FIG. 11B is a view of the elongate flexible carrier 8 when in a straight configuration. FIG. 11C is a side view of the elongate flexible carrier when in a straight configuration. FIG. 11D is a plan view of the elongate flexible carrier 11 when in a curved configuration. The elongate flexible carrier 11 comprises a plurality of detachable (or decouplable) discrete sensing element carrying portions 112. FIGS. 11E to 11I show various views of a single one of the detachable discrete sensing element carrying portions 112.

The discrete sensing element carrying portions 112 of FIGS. 11A to 11I are substantially the same as those of FIG. 8A to 8H. The main difference between the two types of carrying portion is that in the carrying portions 112 of FIGS. 11A to 11I, the female hinge parts 115 do not extend from the spool portion 113. Instead, the female hinge parts 115 include apertures 115 formed in the spool portion 113. The male hinge parts 114 of an adjacent carrying portion extend into an interior region 113-1 of the spool portion and protrusions 114-1 formed on the male hinge parts 114 couple with the apertures 115 of the female hinge part 115. In this way, the axis of rotation of two adjacent carrying portions 112 is approximately at the centre of the discrete sensing element. This causes the centre-to-centre separations of the discrete sensing elements to be maintained even as the carrying portions rotate relative to one another.

As can be seen from FIGS. 11H and 11I, the interior region 113-1 of the spool part 113 includes a shaped recess which is configured so as to allow the male hinge part 114 of an adjacent carrying portion 112 to rotate therein.

FIGS. 12A and 12B illustrate aspects of a variant of the elongate flexible carrier described with reference to FIGS. 4A to 4F. The main difference between the carrier 4 of FIGS. 4A to 4F and the carrier 13 of FIGS. 12A and 12B is that the cross-section of the carrying part 132 has an even aspect ratio. In this specific example, the cross-section is circular. Many of the other features of the carrier 4 of FIGS. 4A to 4F may also be present in the carrier 13 of FIGS. 12 and 12B. Such features include the hinge portions 134 (which may or may not be offset), the flanges 136 provided at opposite ends of the carrying part 132 (which may be referred to a spool part), the guides (or pegs) 138 for guiding the connecting elements from one discrete sensing element to the next, as well as the apertures 139 formed through the thickness of the carrying part. Although not shown in FIGS. 12A and 12B, it will be appreciated that the elongate carrier 13 may also be provided with projections for providing asymmetric flexibility of the carrier 13.

Figure 13B:
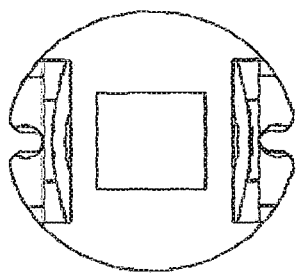
FIGS. 13A and 13B illustrate aspects of a variant of the elongate flexible carrier described with reference to FIGS. 8A to 8H.
Figure 13A:
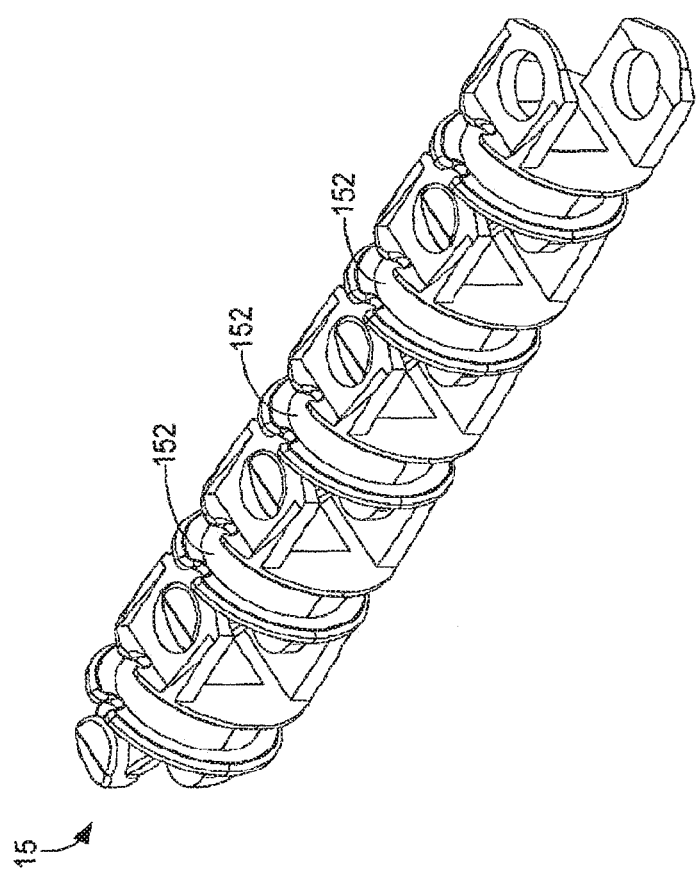
Figure 15B:
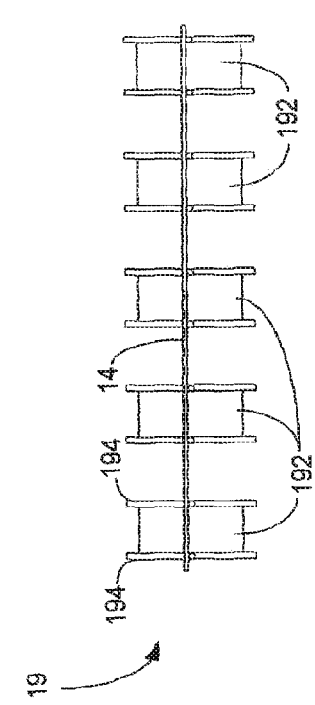
FIGS. 15A to 15D illustrate aspects of an alternative elongate flexible carrier.
Figure 15C:
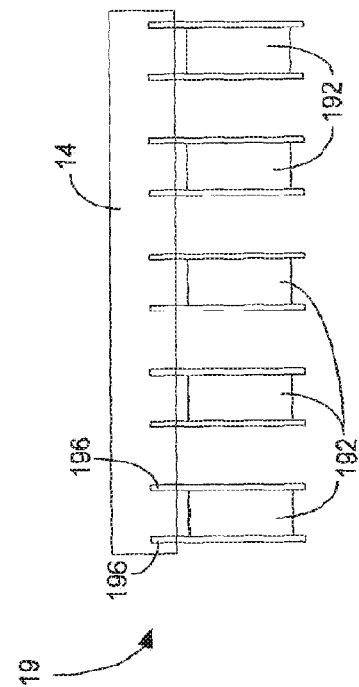
Figure 15A:
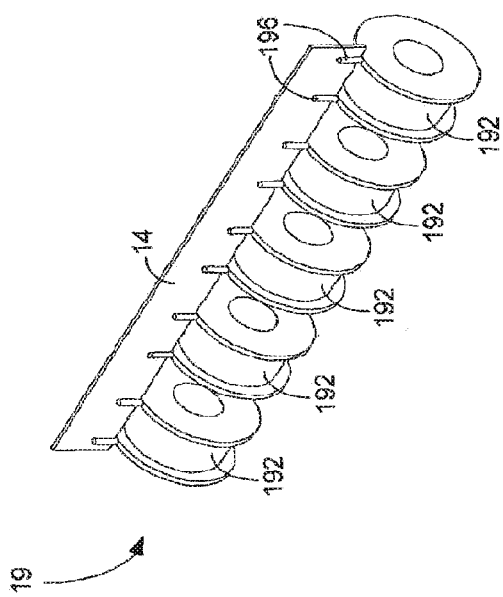
Figure 15D:
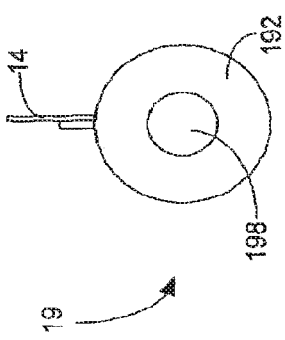

FIGS. 13A and 13B illustrate aspects of a variant of the elongate flexible carrier described with reference to FIGS. 8A to 8H. The main difference between the carrier 8 of FIGS. 8A to 8H and the carrier 15 of FIGS. 13A and 13B is that the spool part of each detachable (or decouplable) discrete sensing element carrying portion has a cross-section having an even aspect ratio. In this example the cross-section is circular. The other features of the carrier 15 may be the same as described with reference to FIGS. 8A to 8H.

Although not illustrated in the Figures, it will be appreciated that the spool parts of any of the carriers of FIGS. 7, 10 and 11 may have cross-sections having an even aspect ratio. Similarly, the sensing element of any of the other Figures described herein may be configured with a cross-section having an even aspect ratio.

FIGS. 14A to 14D illustrate aspects of a variant of the flexible current sensor arrangement of FIGS. 1A to 1E. The sensor arrangement of FIGS. 14A to 14D is substantially as described with reference to FIG. 1. However, in the arrangement of FIGS. 14A to 14D, the elongate flexible carrier comprises an elongate flexible PCB. The discrete sensing elements are mechanically and electrically connected to the flexible PCB 14. This PCB 14 acts to electrically connect the discrete sensing elements in series. This may avoid the need for a separate carrier 14 and connecting elements. In FIGS. 14A to 14D the discrete sensing elements 12 are wound coils of wire.

However, they may instead be, for example, conductive tracks printed onto planar circuit boards (such as in the example of FIGS. 2A to 2D.

FIGS. 15A to 15D illustrate aspects of an alternative elongate flexible carrier 19 for carrying discrete sensing elements. The elongate flexible carrier 19 comprises a plurality of discrete carriers 192 for carrying a sensing element (not shown in FIGS. 15A to 15D). Each of the discrete carriers 192 comprises a spool part around which a discrete sensing element can be wound. In this example, the carriers 192 comprise flanges, disposed at either end thereof, for retaining the sensing element on the discrete carrier 192. The discrete carriers 192 are distributed along an elongate flexible carrier 14. In this example, the elongate flexible carrier 14 comprises a flexible PCB. Each of the discrete carriers comprises plural (in this example, two) electrically conductive projections 196 extending from the discrete carrier 192. The projections 196 are mechanically and electrically connected to the elongate flexible PCB 14. The ends of the coil, which forms each discrete sensing element, are wound around different ones of the conductive projections, thereby electrically connecting the discrete sensing elements with the flexible PCB and also in series with one another. Each discrete carrier has an aperture 198 formed there though. This allows the discrete carriers 192 to be threaded onto a mandrel, thereby facilitating winding of the discrete sensing elements onto the discrete carriers 192.

In the example of FIGS. 15A to 15D, the spool parts of the discrete carriers have a cross-section having an even aspect ratio (specifically, circular). However, they may instead be configured with an uneven aspect ratio.

FIGS. 16A to 16G illustrate aspects of another elongate flexible carrier 19 for carrying discrete sensing elements. FIGS. 16 and 16B show perspective views of the carrier in curved and straight configurations respectively. FIGS. 16C and 16D show plan views of the carrier 20 in the curved and straight configurations respectively. FIGS. 16E and 16F show cross-sectional views through the carrier 20 in its curved and straight configurations respectively. FIG. 16G shows a cross-section through the carrier 20 along, for example, the dashed line denoted G on FIG. 16D.

The carrier 20 comprises a plurality of carrying portions 202. In this specific example, the carrying portions are in the form of spools for carrying coils of wire which form the discrete sensing elements. The carrying portions 202 have a cross-section having an even aspect ratio. It will be appreciated however, that the carrying portions 202 may instead have an uneven cross-sectional aspect ratio.

The carrier 20 also comprises a plurality of linking portions 204 which link the carrying portions 204 to one another. The linking portions 204 are received in apertures formed in the carrying portions 202. The linking portions 204 couple with adjacent linking portions within the apertures formed in the carrying portions 204. The linking portions 204 have geared end faces. The geared end faces are curved. The geared end faces of the linking portions 204 mesh together with the geared end faces of adjacent portions 204, thereby allowing rotation of the linking portions 204 relative to one another.

The linking portions are coupled to the carrying portions 202 via hinge features 206 extending from opposites sides of the ends of the linking portions 204. The hinge features 206 are rotatably received in apertures formed in the interior of the carrying portions 202. The elongate teeth of the geared end faces extend in the same direction as the hinge features 206.

A carrier 20 configured in this way controls the angle of the discrete sensing elements provided on the carrying portions 202 such that planes of zero sensitivity to uniform fields of the sensor elements are always directed towards the centre of the loop formed by the carrier 20. This provides a highly accurate sensor arrangement.

Although not shown in any of the figures, the flexible sensor arrangement may be provided within an insulating sheath. The insulating sheath may be of a plastics or rubber material. The insulating sheath may include an electrostatic screening layer. The electrostatic screening layer may comprise, for example, a semiconducting layer or a metal layer, such as copper braid. Alternatively or additionally, the output cable 16 may be coaxial such that it includes a metal screen layer. The screen layer of the output cable may be electrically connected to the discrete sensing element 12 that is in the electrical middle of the string of sensing elements 12.

In the above examples, the connection mechanism 10A, 10B is configured such that the spacing of all discrete sensing elements 12 around the loop is even. However, in some examples, this may not be the case and the separation between the final sensing elements in the string may be greater than the separation between the other sensing elements 12. In such examples, the number of turns or the area of the sensing elements at either end of the string may be increased to compensate for the increased separation. In such examples, the separation between each final sensing element and the adjacent element may be increased by half the difference between separation of the final sensing elements and the separation of the other elements in the string. Alternatively, the final two sensing elements at each end of the string may be moved towards one another, while maintaining the halfway point between the sensing elements.

It should be realized that the foregoing embodiments should not be construed as limiting. Other variations and modifications will be apparent to persons skilled in the art upon reading the present application. Moreover, the disclosure of the present application should be understood to include any novel features or any novel combination of features either explicitly or implicitly disclosed herein or any generalization thereof and during the prosecution of the present application or of any application derived therefrom, new claims may be formulated to cover any such features and/or combination of such features. As an example of such a combination, in some embodiments, the PCB sensing elements of FIGS. 2 and 3 may be utilised with elongate flexible carriers of the type described with reference to FIGS. 4 to 11.

The invention claimed is:

1. A flexible current sensor arrangement comprising a plurality of discrete current sensing elements distributed along an elongate flexible carrier, the elongate flexible carrier comprising a plurality of spools linked to one another by linking portions, each of the spools being configured to receive at least one current sensing element, the linking portions being configured to allow rotation of adjacent spools about an axis of rotation, the linking portions being aligned with the longitudinal axis of the elongate flexible carrier or being offset from the longitudinal axis such that, as adjacent spools rotate about the linking portions, a centre-to-centre separation of the adjacent spools is maintained at closer to a constant value on average than when the linking portions are aligned with the longitudinal axis.

2. The flexible current sensor arrangement of claim 1, wherein a cross-section of each sensing element, through which the flexible carrier passes, is longer in a first dimension than in a second dimension, the first dimension being parallel to the axis of rotation.

3. The flexible current sensor arrangement of claim 1, the flexible current sensor arrangement being configurable into an openable loop.

4. The flexible current sensor arrangement of claim 1, wherein the elongate flexible carrier is configured such that it has a preferred axis of flexure.

5. The flexible current sensor arrangement of claim 4, wherein the elongate flexible carrier is configured such that is has a single axis of flexure.

6. The flexible current sensor arrangement of claim 4, wherein the flexibility of the elongate flexible carrier about the preferred axis of flexure is asymmetric.

7. The flexible current sensor arrangement of claim 3, wherein when the arrangement is configured in a loop, opposing ends of the flexible carrier lie in the same plane as the remainder of the carrier.

8. The flexible current sensor arrangement of claim 1, wherein the discrete sensing elements are substantially equidistantly spaced along the elongate flexible carrier.

9. The flexible current sensor arrangement of claim 1, comprising:
a first connector element at a first end of the elongate flexible carrier;

a second connector element at a second end of the elongate flexible carrier, the first and second connector elements being configured to engage releasably with one another to form the sensor arrangement into a closed loop, wherein the discrete sensing elements are equidistantly spaced around the closed loop.

10. The flexible current sensor arrangement of claim 9, wherein the first and second connector elements are configured such that, when they are connected to one another thereby configuring the arrangement into a closed loop, the distance between the sensing elements at each end of the carrier is substantially the same as the distance between each of the other sensing elements on the carrier and its immediate neighbours.

11. The flexible current sensor arrangement of claim 1, the elongate flexible carrier passing through a central region of each of the current sensing elements.

12. The flexible current sensor arrangement of claim 1, each current sensing element having a plane of zero sensitivity to uniform magnetic fields, the flexible current sensor arrangement being configured such that the plane of zero sensitivity of each sensing element is substantially locally perpendicular to the longitudinal axis of a portion of the elongate flexible carrier on which it is carried.

13. The flexible current sensor arrangement of claim 1, wherein the discrete sensing elements comprise a plurality of turns of copper wire wound around one of the spools.

14. The flexible current sensor arrangement of claim 1, wherein the plurality of linked carrier portions are detachably linked to one another by the linking portions.

15. The flexible current sensor arrangement of claim 1, wherein the linking portions are permanently coupled to the spools such that adjacent spools cannot be detached from one another.

16. The flexible current sensor arrangement of claim 1 wherein the linking portions are configured so as to minimise a change in separation of centres of adjacent spools as the spools rotate about the linking portions.

17. The flexible current sensor arrangement of claim 1, wherein the linking portions are offset from the longitudinal axis towards a preferred direction of flexure of the flexible elongate carrier.

18. The flexible current sensor arrangement of claim 1, wherein the discrete current sensing elements comprise circuit board coils centrally mounted on the elongate flexible carrier.

19. An elongate flexible member for a current sensor arrangement, the elongate flexible member comprising a plurality of spools linked to one another by linking portions, each spool being configured for receiving a discrete current sensing element, the linking portions allowing rotation of adjacent spools about an axis of rotation, the linking portions being aligned with the longitudinal axis of the elongate flexible carrier or being offset from the longitudinal axis such that, as adjacent spools rotate about the linking portions, a centre-to-centre separation of the adjacent spools is maintained at closer to a constant value on average than when the linking portions are aligned with the longitudinal axis.

20. A method of manufacturing a flexible current sensor arrangement, the method comprising:
providing an elongate flexible carrier, the elongate flexible carrier comprising a plurality of spools linked to one another by linking portions, each of the spools being configured to receive at least one current sensing element, the linking portions allowing rotation of adjacent spools about an axis of rotation, the linking portions being aligned with the longitudinal axis of the elongate flexible carrier or being offset from the longitudinal axis such that, as adjacent spools rotate about the linking portions, a centre-to-centre separation of the adjacent spools is maintained at closer to a constant value on average than when the linking portions are aligned with the longitudinal axis; and
distributing a plurality of discrete sensing elements along the elongate flexible carrier.

* * * * *